(12) United States Patent
Pergande

(10) Patent No.: US 9,061,423 B2
(45) Date of Patent: Jun. 23, 2015

(54) WAFER HANDLING APPARATUS

(71) Applicant: Varian Semiconductor Equipment Associates, Inc., Gloucester, MA (US)

(72) Inventor: Paul E. Pergande, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/800,829

(22) Filed: Mar. 13, 2013

(65) Prior Publication Data

US 2014/0265393 A1    Sep. 18, 2014

(51) Int. Cl.
| | |
|---|---|
| *B25J 15/00* | (2006.01) |
| *B25J 11/00* | (2006.01) |
| *H01L 21/677* | (2006.01) |
| *H01L 21/687* | (2006.01) |

(52) U.S. Cl.
CPC ........ *B25J 15/0014* (2013.01); *B25J 11/0095* (2013.01); *H01L 21/67742* (2013.01); *H01L 21/68707* (2013.01)

(58) Field of Classification Search
USPC ............. 294/213, 7, 8, 902; 414/941, 222.01, 414/752.1, 744.8; 901/41
See application file for complete search history.

(56) References Cited

U.S. PATENT DOCUMENTS

| | | | |
|---|---|---|---|
| 5,746,460 A * | 5/1998 | Marohl et al. | 294/213 |
| 6,676,181 B1 * | 1/2004 | Greiner | 294/7 |
| 6,746,062 B2 * | 6/2004 | Bielecki et al. | 294/7 |
| 7,520,545 B2 * | 4/2009 | Kim | 294/213 |
| 7,654,596 B2 * | 2/2010 | Mantz | 294/103.1 |
| 7,802,830 B2 * | 9/2010 | Brueckner et al. | 294/185 |
| 7,878,562 B2 * | 2/2011 | Hamano et al. | 294/213 |
| 2005/0285419 A1 * | 12/2005 | Matsumoto et al. | 294/902 |
| 2006/0216137 A1 * | 9/2006 | Sakata et al. | 414/222.13 |
| 2011/0108742 A1 | 5/2011 | Weaver et al. | |
| 2011/0286818 A1 * | 11/2011 | Kim et al. | 414/222.01 |
| 2012/0251272 A1 * | 10/2012 | Snodgrass et al. | 414/222.01 |
| 2013/0209198 A1 * | 8/2013 | Forderhase et al. | 414/222.01 |

* cited by examiner

*Primary Examiner* — Paul T Chin

(57) ABSTRACT

Disclosed is an end effector apparatus including a base including a wrist coupling component. The base may be substantially triangular in shape. A plurality of fingers extends from the base. Each finger includes a plurality of wafer support pads for supporting wafers being processed. Each finger has a width dimension, a height dimension and a length dimension, wherein the height dimension tapers smaller along at least a tip portion of the finger.

20 Claims, 4 Drawing Sheets

100

100

US 9,061,423 B2

WAFER HANDLING APPARATUS

BACKGROUND OF THE INVENTION

1. Field of the Invention

Embodiments of the invention relate to the field of device fabrication. More particularly, the present invention relates to a wafer handling end effector apparatus used to transport wafer materials among devices.

2. Discussion of Related Art

Silicon wafers are used in semiconductor and/or solar cell fabrication. The wafers are subjected to a multi-step manufacturing process that may involve a plurality of machines and a plurality of stations. Thus, the wafers need to be transported from one machine/station to another machine/station one or more times.

When transporting wafers from station to station or machine to machine in a manufacturing process, apparatuses called end effectors are typically employed. A typical end effector apparatus may be hand-like in appearance. A base unit may attach to a plurality of finger-like extensions. On each of the finger-like extensions, a plurality of wafers may be seated atop wafer pads at spaced apart intervals. The end result may be a matrix of wafers supported by the plurality of end effector fingers. The end effector may typically be moved linearly (e.g., forward and backward) as well as rotationally all in the same plane (e.g., x-y axis). The end effector may also be moved in a third direction along a z-axis to provide a full range of motion.

There are several styles of wafer interface features used in semiconductor wafer handling equipment. Sometimes silicone pads are used to isolate the silicon wafer from the metallic robot end effector fingers to prevent contamination of the wafer by the metallic arm. Sometimes wafers sit on hard slippery pads affixed at periodic intervals along the end effector fingers. The hard slippery pads are typically made of a polyetheretherketone (PEEK) plastic. PEEK is a high performance thermoplastic material comprised of a polymer that is semi-crystalline. PEEK polymer is advantageous in that retains its mechanical properties at extremely high temperatures, is weldable, machinable, and can be bonded with epoxies cyanoacrylates, polyurethanes, or silicones.

One of the characteristics of an end effector apparatus is its rigidity. An end effector apparatus should be rigid enough to withstand the forces that are applied to it during normal operation. An end effector apparatus should be rigid enough to operate at higher speeds. Higher speeds translate to greater product workflow as measured by the number of wafers that can be handled per hour (WPH) by a wafer handling robot. Increasing the WPH allows the wafer handling robot to process more wafers leading to a more productive and efficient process.

End effector apparatus stiffness or rigidity can impact the speed at which the wafer handling robot can operate and consequently, impact the number of wafers that can be processed (e.g., WPH). One measurement or characteristic of an end effector apparatus is its natural frequency. Natural frequency is the frequency at which a system naturally vibrates once it has been set into motion. In other words, natural frequency is the number of times a system will oscillate (move back and forth) between its original position and its displaced position, if there is no outside interference. Resonance is the buildup of large vibration amplitude that occurs when an object is excited at its natural frequency. Undesirable mechanical resonance can cause bridges to collapse, aircraft wings to break, and machinery to break or malfunction.

The natural frequency of the end effector apparatus is one factor that contributes to the overall stiffness and system stability. The higher the natural frequency, the stiffer the end effector apparatus, thus the more stable the wafer handling system. For example, typical end effector apparatuses exhibit a natural frequency of approximately 20 to 27 Hz and systems using such an end effector apparatus can process approximately 1700 wafers per hour (WPH). Another factor affecting WPH may be the mass of an end effector apparatus. Minimizing mass while maximizing the natural frequency leads to an optimized end effector apparatus for throughput and stability purposes as measured by WPH.

SUMMARY OF THE INVENTION

In view of the foregoing, there's a need to minimize mass while maximizing the natural frequency of an end effector apparatus to increase the throughput of a wafer handling robot tasked with moving wafers from station to station in a manufacturing process. In one embodiment there is disclosed an end effector apparatus including a base including a wrist coupling component. The base may be substantially triangular in shape. A plurality of fingers extends from the base. Each finger includes a plurality of wafer support pads for supporting wafers being processed. Each finger has a width dimension, a height dimension and a length dimension, wherein the height dimension tapers smaller along at least a latter portion of the length of the finger.

In another embodiment, the base further comprises a base floor portion and a base frame portion extending upward from the base floor portion, the base frame portion comprised of a perimeter wall and a plurality of ribs spaced apart at angular intervals.

In another embodiment, each of the plurality of fingers further comprises a pair of opposing side walls connected by a top wall. Each finger further includes a plurality of holes dispersed along the length of the top wall where the plurality of circular holes may have a diameter between 30% to 80% of the width of the top wall.

DESCRIPTION OF EMBODIMENTS

Figure 1:
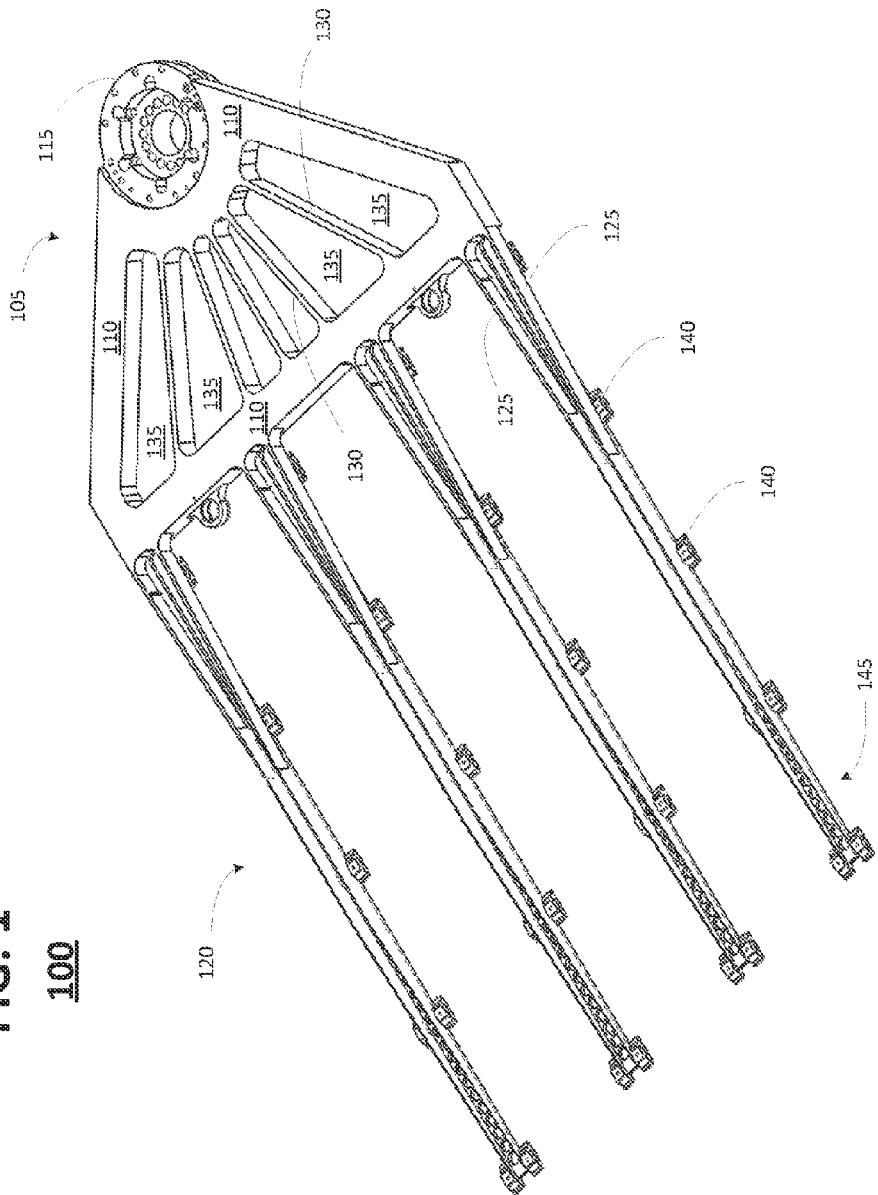
FIG. 1 is a bottom perspective view illustration of one embodiment of an end effector apparatus.

The embodiments described herein present materials and geometries that maximize the natural frequency and minimize the mass of an end effector apparatus. An end effector apparatus may be characterized as a hand-like apparatus comprising a base and fingers. The fingers and base of the embodiments describe features that have been optimized to maximize the natural frequency and minimize the mass of the end effector apparatus. For example, the fingers may include a tapered design. The fingers and base may include a plurality of holes to minimize mass. The base may include a plurality of radial ribs separated by partially or fully cutout areas of the base. The thickness and angular spacing of the radial ribs may also affect the mass and natural frequency of an end effector apparatus. The thickness of the fingers and base may be manipulated as well. These and other features are more fully described in the description that follows.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a bottom perspective view illustration of one embodiment of an end effector apparatus 100 generally comprised of a substantially triangular shaped base 105 and a plurality of fingers 120 extending therefrom. The base 105 includes a wrist coupling component 115 adapted to attach the end effector apparatus 100 to a larger transporting device such as, for instance, a robotic arm (not shown). The robotic arm is movable in a variety of directions (e.g., up, down, forward, backward, left, right) and can even rotate the end effector apparatus 100 via the wrist coupling component 115.

The base 105 may be further comprised of a frame having a perimeter wall 110 and a plurality of radial ribs 130. Between each of the radial ribs 130 may be cutout area 135. The cutout areas 135 remove mass from the end effector apparatus 100 while the radial ribs 130 maintain a structural integrity and stiffness. In another embodiment, the cutout area 135 may be replaced by a floor portion that is substantially thinner than and integrated with the frame.

The base 105 may further be comprised of a plurality of paired sets of base ribs 125. Each paired set of base ribs 125 extends from the edge opposite the wrist coupling 115 of the substantially triangular shaped base 105. The paired sets of base ribs 125 are tapered such that the opposing base ribs 125 converge toward one another as they get further from the base 105. The opposing base ribs 125 are also configured to surround a portion of a finger 120. In this configuration, an additional measure of stability or stiffness may be achieved. The fingers 120 include a plurality of wafer supports 140 adapted to receive and seat a plurality of wafers. Other features and characteristics of the fingers 120 are described in more detail with reference to FIGS. 2-4.

Figure 1A:
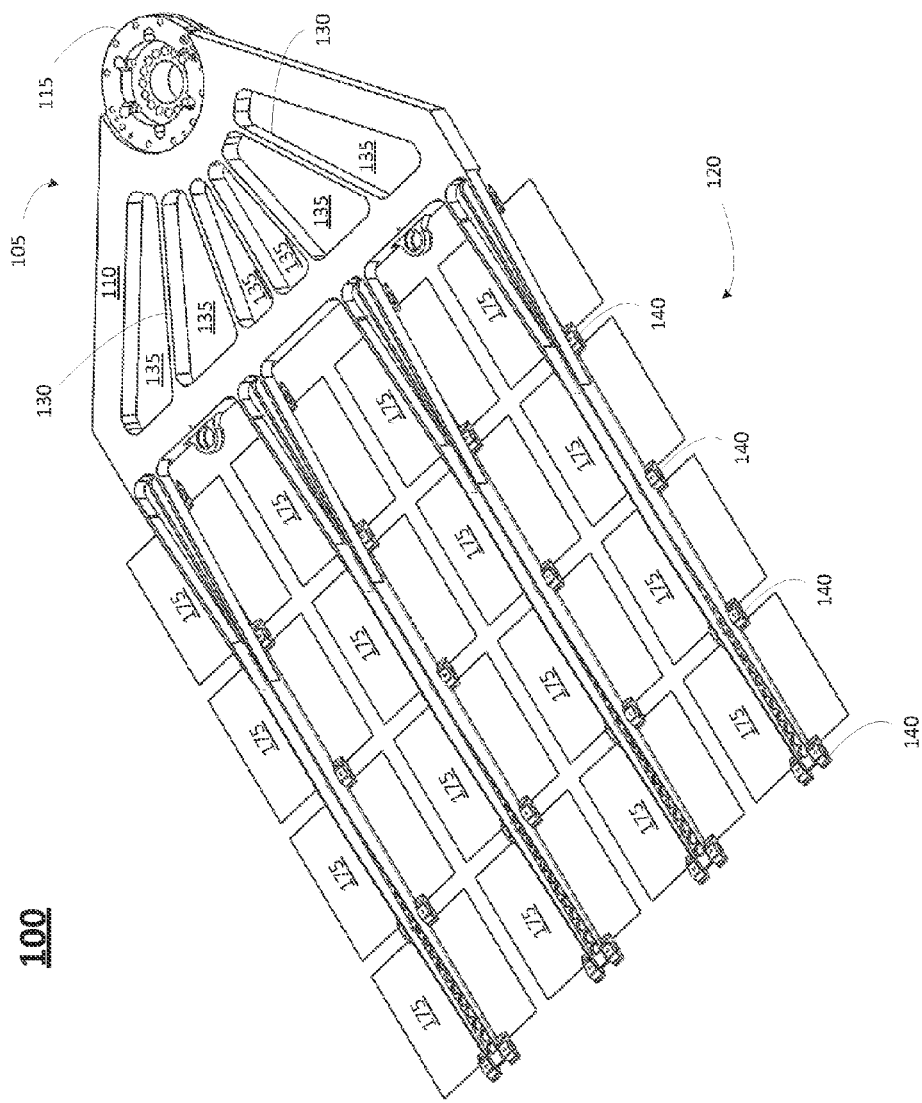
FIG. 1A is a bottom perspective view illustration of one embodiment of an end effector apparatus with a plurality of wafers seated thereon.

FIG. 1A is a bottom perspective view illustration of one embodiment of an end effector apparatus 100 with a plurality of wafers 175 seated thereon. The wafers 175 (shown upside down) are seated upon the wafer supports 140 and may be delivered from station to station in a manufacturing process by way of, for instance, a robotic arm coupled to the wrist coupling component 115 of the end effector apparatus 100. This illustration also shows the substantially triangular shaped base 105 and the plurality of fingers 120 extending therefrom. The base 105 includes the wrist coupling component 115 adapted to attach the end effector apparatus 100 to a larger transporting device such as, for instance, a robotic arm (not shown).

The wafer supports 140 provide multiple points of contact upon which a wafer 175 may be seated. In this embodiment, each wafer support 140 presents four points of contact upon which a wafer 175 may rest. Each wafer support 140 may be removably attachable to the end effector apparatus 100—specifically to an end effector finger 120. The fingers 120 are typically made from metal (e.g., aluminum) for strength, rigidity, and resonance so as to perform satisfactorily during its operation of delivering wafers 175 from station to station in a manufacturing process. The metal, however, needs to be shielded from the wafers 175 it is tasked with delivering because the metal may contaminate the wafer 175 and change the desired properties of the wafer 175. Thus, the wafer support 140 is comprised of a polymer material, such as, for instance, polyetheretherketone (PEEK).

The wafer support 140 may be removably attachable using a snap-fit coupling in which the wafer support 140 fits snugly about a portion of a finger 120 but may still be removed and replaced if necessary. Threaded fasteners may also be used to attach the wafer support 140 to the finger 120. Other fastening methods likewise can be used to attach the wafer support 140 to the finger 120.

In this bottom view, a plurality of wafers 175 is shown seated on a plurality of wafer supports 140. In this example, each wafer 175 is associated with a single end effector finger 120. A plurality of wafers 175 are spaced apart and positioned along the length of each end effector finger 120 to form a row. Each wafer 175 rests upon two opposing or adjacent wafer supports 140. In addition, each wafer support 140 includes four flat portions and four alignment lip portions operatively arranged in pairs: a front facing side by side pair and a rear facing side by side pair. The flat portions 141 and alignment lips 142 are shown in more detail with respect to FIG. 3. The side by side front and rear facing pairs each straddle the end effector finger 120. Each wafer 175 may rest upon a rear facing pair of one wafer support 140 and a front facing pair of the next wafer support 140 along the end effector finger 120. The wafers 175 may be aligned to either the front or rear sets of alignment lip portions, but not both. The wafers 175 are positioned against one set of lip portion alignment features. This works because there is a small gap on the other side. In this arrangement, a wafer 175 may contact four surfaces operative to keep the wafers in place during motion of the end effector apparatus 300. This arrangement is repeated for each of the end effector fingers 120 to produce a matrix of wafers 175 that can be reliably and efficiently moved with less chance of a wafer 175 slipping out of alignment.

Figure 2:
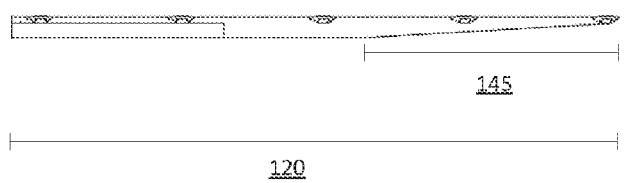
FIG. 2 is a side view illustration of one embodiment of a finger of an end effector apparatus.

FIG. 2 is a side view illustration of one embodiment of a finger 120 of an end effector apparatus 100. In this illustration, the finger 120 shows a tapered tip portion 145. Each finger 120 has a height, width and length dimension. The tapered tip portion 145 tapers along the length dimension of the finger such that the height dimension decreases in magnitude as the tip of the finger 120 approaches its terminus. In one embodiment, the tapered tip portion 145 may extend 40% of the length of the finger 140 from the tip of the finger 120 toward the base 105 (shown in FIG. 1). In another embodiment, the tapered tip portion 145 may range from 20% to 40% of the length of the finger 140 from the tip of the finger 120 toward the base 105.

Figure 3:
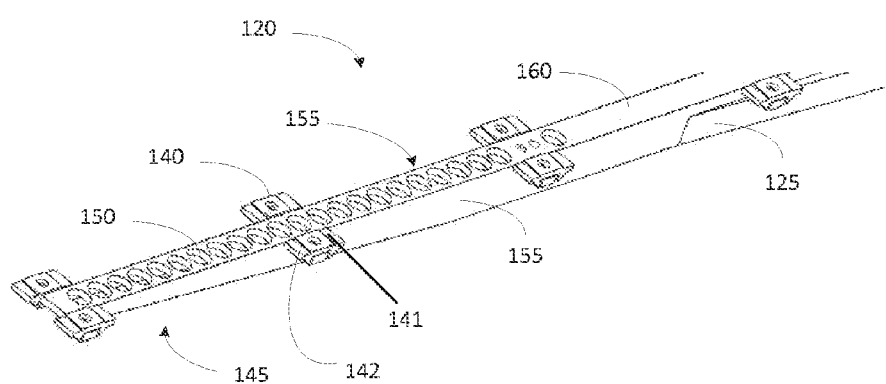
FIG. 3 is a top perspective view illustration of one embodiment of a finger of an end effector apparatus.

FIG. 3 is a top perspective view illustration of one embodiment of a finger 120 of an end effector apparatus 100. In this illustration, the finger 120 is comprised of a pair of opposing side walls 155 with a top wall 160 interposed and coupled therebetween. The wafer supports 140 are periodically attached along the length of the finger 120. One of the base side ribs 125 is also shown at one end of finger 120. Finger 120 further includes a plurality of holes 150 dispersed along the length of the top wall 160 for at least a portion of finger 120. The holes 150 provide negative space meaning that the overall mass of the finger 120 is reduced due to removal of material to form the holes 150. The holes 150 are presented as circular in this illustration, but may be oblong or other shaped sufficient to remove material to reduce the mass of the finger 120. In one embodiment, the holes 150 may extend up to 50% of the length of the finger 120 from the finger tip toward the base 105 (shown in FIG. 1). For circular holes 150, the center spacing may be, for instance, 1.2 times the diameter of the hole and the hole diameter may be between 30% to 80% of the width of the top wall 160. In one embodiment, the thickness of the top wall 160 may range from 10% to 50% of the height of the side walls 155. The thickness of the side walls 155 range from 3% to 10% of the width of the finger 160.

Each wafer support 140 may include a flat portion 141 upon which a wafer 175 (or portion thereof) may be seated and an alignment lip portion 142 that protrudes or extends upward normal to the flat portion 141. The alignment lip portion 142 may be operative to provide a stop for a seated wafer 175 especially when the entire end effector apparatus 100 is in motion. The alignment lip portion 142 may have a slight curvature to assist in wafer 175 placement in which the peak or apex point of the curvature may be characterized as the alignment point when used in conjunction with other wafer support(s) 140. In addition, the alignment lip portion 142 may be operative to align the wafers 175 supported by the wafer support 140 by working in conjunction with other wafer support(s) 140. The alignment lip portion(s) 142 of other wafer support(s) 140 are all aligned such that the wafers 175 align themselves when in contact with the respective alignment lip portion(s) 142.

Figure 4:
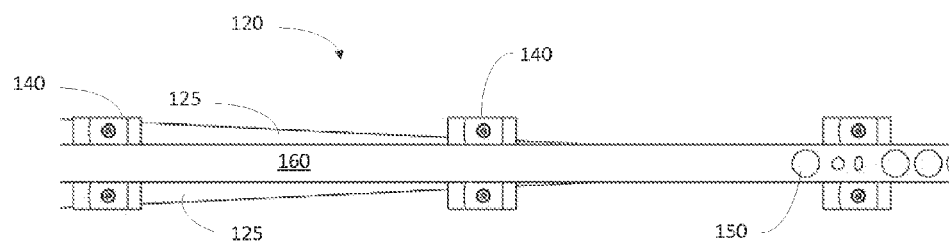
FIG. 4 is a top view illustration of one embodiment of a finger of an end effector apparatus.

FIG. 4 is a top view illustration of one embodiment of a finger 120 of an end effector apparatus 100. In this illustration, the finger 120 is partially pictured from left to right as extending from the base 105 (shown in FIG. 1) toward the finger tip. A paired set of opposing base ribs 125 extend from the base 105 toward the finger tip. The opposing base ribs 125 may extend from the base 105 toward the finger tip up to 10% to 50% of the finger length with one embodiment at 25% the length of the finger 120. The wafer supports 140 are again show periodically spaced along the length of finger 120. At the right side of FIG. 4, holes 150 begin to appear through the top wall 160 of finger 120.

Figure 5:
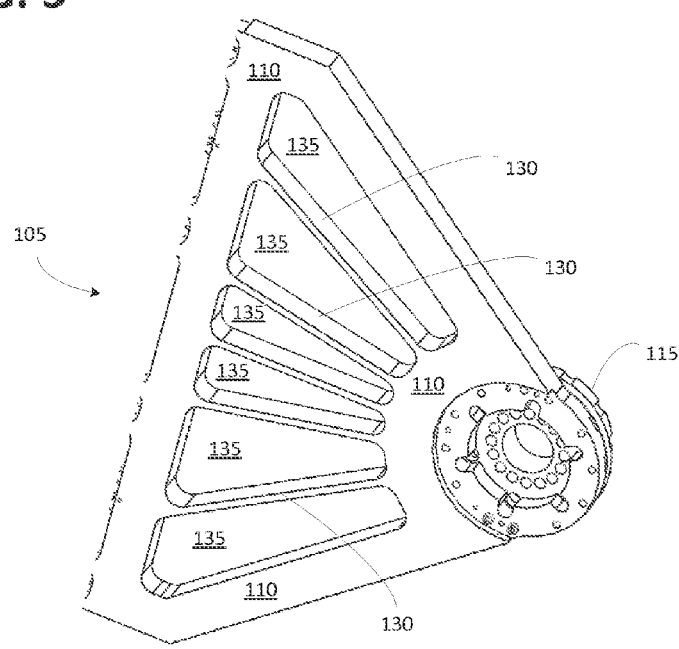
FIG. 5 is a bottom perspective view illustration of one embodiment of a base of an end effector apparatus.

FIG. 5 is a bottom perspective view illustration of one embodiment of a base 105 of an end effector apparatus 100. In this illustration, the perimeter wall 110 substantially forms a triangle with the wrist coupling 115 at one vertex of the triangle. The paired sets of base ribs 125 and fingers 120 extend outward from the edge of the base 105 opposite the wrist coupling 115. A plurality of cutout areas 135 are defined by a base frame. The base frame includes the perimeter wall 110 and a plurality of radial ribs 130 that generally extend outward in a radial pattern from a region near the wrist coupling component 115 toward the edge of the base 105 opposite the wrist coupling component 115. The intersections of the radial ribs 130 and the perimeter wall 110 define the cutout areas 135.

In one embodiment, the radial ribs may be more concentrated in the center area of the base 105 and less concentrated as the pattern extends out radially. The radial ribs 130 and perimeter wall 110 that make up the frame of the base 105 provide stability and stiffness for the overall end effector apparatus 100. In another embodiment, a floor portion (not shown) replaces the cutout areas 135. In this case, the cutout areas become the floor portion. The floor portion is substantially thinner height-wise than the perimeter wall 110. In one embodiment, for instance, the floor portion may be 3% of the height of the perimeter wall 110. The floor portion may range from 1% to 25% of the perimeter wall height. In addition, the width of the perimeter walls 110 may range from 50% to 250% of the height of the perimeter walls 110. Similarly, the width of the radial ribs 130 may range from 25% to 50% of the height of the radial ribs 130. The height of the radial ribs 130 and the perimeter wall 110 is substantially the same.

The end effector apparatus 100 including the base 105 and fingers 120 may be comprised of aluminum in one embodiment. In another embodiment, the end effector apparatus 100 including the base 105 and fingers 120 may be comprised of magnesium or titanium.

The embodiments described above have been implemented for an end effector apparatus designed to carry a 4×4 array of 164 mm solar cells (wafers). The techniques described led to an optimized base and finger geometry for the end effector apparatus to achieve a maximized natural frequency and a minimized mass. The end effector apparatus exhibited a natural frequency of approximately 45 Hz where predecessor end effector apparatuses exhibited a natural frequency of approximately 27 Hz. Coupled with the reduced mass of the end effector apparatus resulting from the various tapered portions, the holes in the top wall of the fingers, and the cutout areas in the base, the end effector apparatus was able to improve throughput of wafer handling by approximately 20%.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An end effector apparatus for handling semiconductor wafers comprising:
   a substantially triangular shaped base including a wrist coupling component at a vertex; and
   a plurality of fingers extending outward from an edge opposite the wrist coupling component, each finger including a plurality of wafer support pads, each finger having a width dimension, a height dimension and a length dimension, wherein the height dimension tapers smaller along at least a tip portion of the finger,
   wherein the base further comprises
   a plurality of cutout areas defined by a base frame, the base frame comprised of a perimeter wall and a plurality of radial ribs spaced apart at angular intervals defined by the radial ribs; and
   a plurality of paired base rib sets extending outward from an edge of the base opposite the wrist coupling component, each of the paired base rib sets adapted to surround a portion of one of the fingers.

2. The end effector apparatus of claim 1, each rib of one of the paired base rib sets tapering toward one another along a length of the ribs.

3. The end effector apparatus of claim 2, each of the ribs of one of the paired base rib sets extending between 10% to 50% of the length dimension of one of the fingers.

4. The end effector apparatus of claim 1, each of the plurality of fingers further comprised of a pair of opposing side walls connected by a top wall.

5. The end effector apparatus of claim 4, each of the fingers further including a plurality of holes dispersed along a length of the top wall.

6. The end effector apparatus of claim 5, the plurality of holes being circular in shape.

7. The end effector apparatus of claim 5, the plurality of holes being oblong in shape.

8. The end effector apparatus of claim 5, the plurality of holes dispersed along the tip portion of the finger.

9. The end effector apparatus of claim 8, the plurality of holes dispersed along the tip portion of the finger up to 50% of the length dimension of each of the fingers.

10. The end effector apparatus of claim 1, the tip portion of each of the fingers comprising up to 40% of the length dimension.

11. The end effector apparatus of claim 1, wherein the base and the plurality of fingers are comprised of aluminum.

12. The end effector apparatus of claim 1, wherein the base and the plurality of fingers are comprised of magnesium.

13. The end effector apparatus of claim 1, wherein the base and the plurality of fingers are comprised of titanium.

14. An end effector apparatus for handling semiconductor wafers comprising:
   a base including a wrist coupling component at a vertex, the base having a plurality of cutout areas defining a base frame, the base frame including a plurality of radial ribs spaced apart at angular intervals defined by the radial ribs;
   a plurality of fingers extending outward from an edge opposite the wrist coupling component, each of the plurality of fingers being defined by a pair of opposing side walls connected by a top wall;
   a plurality of holes dispersed along a length of the top wall of each of the plurality of fingers; and
   a plurality of wafer support pads displaced along a length of each of the fingers, each of the wafer support pads having a flat portion upon which a portion of a wafer is disposed and a raised alignment edge extending from the flat portion against which a side of the wafer is engaged.

15. An end effector apparatus for handling semiconductor wafers comprising:
   a substantially triangular shaped base including a wrist coupling component at a vertex;
   a plurality of fingers extending outward from an edge opposite the wrist coupling component, each finger including a plurality of wafer support pads, each finger having a width dimension, a height dimension and a length dimension, wherein the height dimension tapers smaller along at least a tip portion of the finger,
   wherein the base further comprises:
      a base floor portion and a base frame portion extending upward from the base floor portion, the base frame portion comprised of a perimeter wall and a plurality of radial ribs spaced apart at angular intervals defined by the radial ribs; and
      a plurality of paired base rib sets extending outward from an edge of the base opposite the wrist coupling component, each of the paired base rib sets adapted to surround a portion of one of the fingers.

16. The end effector apparatus of claim 15, each rib of one of the paired base rib sets tapering toward one another along a length of the ribs.

17. The end effector apparatus of claim 16, each of the ribs of one of the paired base rib sets extending between 10% to 50% of the length dimension of one of the fingers.

18. The end effector apparatus of claim 15, each of the plurality of fingers further comprised of a pair of opposing side walls connected by a top wall.

19. The end effector apparatus of claim 18, each of the fingers further including a plurality of holes dispersed along a length of the top wall.

20. The end effector apparatus of claim 19, the plurality of holes dispersed along the tip portion of the finger.

* * * * *